United States Patent
Jeong et al.

(10) Patent No.: US 9,609,758 B2
(45) Date of Patent: Mar. 28, 2017

(54) DISPLAY DEVICE AND METHOD OF MANUFACTURING THE SAME

(71) Applicant: Samsung Display Co., Ltd., Yongin, Gyeonggi-Do (KR)

(72) Inventors: Chang-Yong Jeong, Yongin (KR); Myong-Suk Han, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 123 days.

(21) Appl. No.: 14/024,582

(22) Filed: Sep. 11, 2013

(65) Prior Publication Data

US 2014/0160695 A1 Jun. 12, 2014

(30) Foreign Application Priority Data

Dec. 10, 2012 (KR) .................. 10-2012-0143029

(51) Int. Cl.
| | |
|---|---|
| H05K 1/00 | (2006.01) |
| H05K 3/30 | (2006.01) |
| H05K 3/36 | (2006.01) |
| H05K 7/20 | (2006.01) |
| G02F 1/1345 | (2006.01) |
| H05K 1/11 | (2006.01) |
| H05K 3/32 | (2006.01) |

(52) U.S. Cl.
CPC ......... *H05K 3/305* (2013.01); *G02F 1/13452* (2013.01); *H05K 3/361* (2013.01); *H05K 7/20472* (2013.01); *H05K 1/117* (2013.01); *H05K 3/323* (2013.01); *H05K 2201/10128* (2013.01); *Y02P 70/613* (2015.11)

(58) Field of Classification Search
USPC .................. 361/749, 748, 750; 438/26
See application file for complete search history.

(56) References Cited

U.S. PATENT DOCUMENTS

| 7,495,716 B2 * | 2/2009 | Kang et al. .................. 349/43 |
| 2012/0224335 A1 * | 9/2012 | Yuan .................. H01L 23/3121 361/749 |

FOREIGN PATENT DOCUMENTS

| JP | 10-117049 A | 5/1998 |
| JP | 2004-055997 A | 2/2004 |
| KR | 10-0696548 B1 | 3/2007 |
| KR | 10-0709255 B1 | 4/2007 |
| KR | 10-2008-0001512 A | 1/2008 |

* cited by examiner

*Primary Examiner* — Andargie M Aychillhum
(74) *Attorney, Agent, or Firm* — Lewis Roca Rothgerber Christie LLP

(57) ABSTRACT

A display device includes: a substrate having a mounting area; a pad electrically coupled to a wire on the substrate and at the same layer as the wire; an adhesive layer bonded to a bottom of the substrate having the mounting area; a supporting substrate bonded to a bottom of the adhesive layer to which the substrate is bonded; a flexible printed circuit board electrically coupled to the pad to input a power and a signal to the pad; and a conductive layer between the flexible printed circuit board and the pad to electrically couple the flexible printed circuit board to the pad, and at least a portion of the adhesive layer on the mounting area is exposed to the outside to be coupled to the conductive layer.

14 Claims, 3 Drawing Sheets

DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-143029, filed on Dec. 10, 2012, in the Korean Intellectual Property Office, the disclosure of which is incorporated herein in its entirety by reference.

BACKGROUND

1. Field

Embodiments of the present invention relate to a device and a method of manufacturing the same, and more particularly, to a display device and a method of manufacturing the same.

2. Description of Related Art

According to a recent trend, many typical displays are being replaced by portable thin flat display devices. The flat display devices may be light receiving type display devices, such as liquid crystal display devices. The flat display devices may also be light emitting type display devices, such as plasma display devices.

A flat display device may include a display region where an image is displayed and a non-display region around the display region, on a substrate. The non-display region may include pads contacting a driver integrated circuit (IC) and wires coupling (e.g., connecting) the display region and the pads. Additionally, a flexible printed circuit board may be coupled (e.g., connected) from the outside to the pads, so that signals may be received from the outside.

In the case of a flexible printed circuit board coupled (e.g., connected) to a pad part, the flexible printed circuit board and the pad part may be separated from each other due to external forces such as external shocks. If the flexible printed circuit board is separated from the pad part, there may be limitations in driving a flat display device. Accordingly, it may be important to maintain the coupling (e.g., connection) between the flexible printed circuit board and the pad part.

SUMMARY

Aspects of embodiments of the prevent invention provide a display device providing a more solid (e.g., solid) coupling (e.g., connection) of a flexible printed circuit board, and a method of manufacturing the same.

According to an aspect of the present invention, there is provided a display device including: a substrate having a mounting area; a pad electrically coupled to a wire on the substrate and at the same layer as the wire; an adhesive layer bonded to a bottom of the substrate having the mounting area; a supporting substrate bonded to a bottom of the adhesive layer to which the substrate is bonded; a flexible printed circuit board electrically coupled to the pad to input a power and a signal to the pad; and a conductive layer between the flexible printed circuit board and the pad to electrically couple the flexible printed circuit board to the pad, and at least a portion of the adhesive layer on the mounting area is exposed to the outside to be coupled to the conductive layer.

The display device may further include an insulation layer on the substrate.

At least a portion of the insulation layer on the mounting area and at least a portion of the substrate may be removed; and a portion of the conductive layer may be coupled to the adhesive layer through the at least the portion of the insulation layer on the mounting area and the at least the portion of the substrate.

The portion of the conductive layer may be inserted in a conductive layer contact hole in the insulation layer and the substrate in the mounting area.

The substrate may be formed only in a display area.

The insulation layer and the pad may be in the mounting area where the substrate is not located, and the conductive layer may surround a border of the insulation layer.

The conductive layer may be an anisotropic conductive film or a self-organizing conductive film.

The display device may further include a pad protective layer at ends of the pad.

The pad protective layer may include at least one of an organic layer and an inorganic layer.

The adhesive layer may include at least one of a silicon inorganic layer, an oxide layer having substantially the same insulating property as the silicon inorganic layer, and a metallic layer.

The supporting substrate may be formed of a plastic or SUS material.

The substrate may be formed of a polyimide (PI) material.

The flexible printed circuit board may include: a body part electrically coupled to an outside; and a terminal part formed at one end of the body part and electrically coupled to the pad through the conductive layer.

According to another aspect of the present invention, there is provided a method of manufacturing a display device, the method including: preparing a substrate having a mounting area and removing at least a portion of the substrate corresponding to the mounting area; forming an organic light emitting device, a thin film transistor for driving the organic light emitting device, and a wire electrically coupling the organic light emitting device and the thin film transistor in a display area of the substrate, and forming a pad electrically coupled to the wire in the mounting area; disposing an adhesive layer and a supporting substrate on a bottom of the substrate; and after a conductive layer and a flexible printed circuit board are sequentially disposed on the pad, bonding the conductive layer, the pad, the flexible printed circuit board, the adhesive layer, and the supporting substrate by pressing the flexible printed circuit board and the supporting substrate together and coupling a portion of the conductive layer to the exposed adhesive layer in the mounting area.

The substrate may be formed of a PI material.

The substrate may be formed on a carrier substrate through a slit die coating process, and during the slit die coating process, application of the PI material on the mounting area may be prevented.

The removing the at least the portion of the substrate may include removing the at least the portion of the substrate through a laser after a laser mark is projected on the at least the portion of the substrate.

The method may further include forming a pad protective layer on an edge of the pad.

The method may further include forming an insulation layer between the substrate and the pad in the mounting area.

The insulation layer may be formed to be substantially identical to a pattern of the substrate.

A portion of the insulation layer where the pad is installed may remain and the remaining portion of the insulation layer and the substrate may be removed.

BRIEF DESCRIPTION OF THE DRAWINGS

The above and other features and aspects of the present invention will become more apparent by describing in detail example embodiments thereof with reference to the attached drawings in which.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

Aspects of the present invention will be clarified through the following embodiments described with reference to the accompanying drawings. The present invention may, however, be embodied in different forms and should not be construed as limited to the embodiments set forth herein. Rather, these embodiments are provided so that this disclosure will be more thorough and complete, and will more fully convey the scope of the present invention to those skilled in the art. Further, the present invention is only defined by the scope of the claims. In the following description, the technical terms are used only for explaining specific embodiments and do not limit the present invention. Terms of a singular form may include plural forms unless referred to the contrary. The meaning of the terms "include," "comprise," "including," or "comprising," may specify a property, a region, a fixed number, a step, a process, an element and/or a component, but does not exclude other properties, regions, fixed numbers, steps, processes, elements and/or components. Also, though terms like a "first" and a "second" are used to describe various members, components, regions, layers, and/or portions in various embodiments of the present invention, the members, components, regions, layers, and/or portions are not limited to these terms. These terms are used only to differentiate one member, component, region, layer, or portion from another one.

Figure 1:
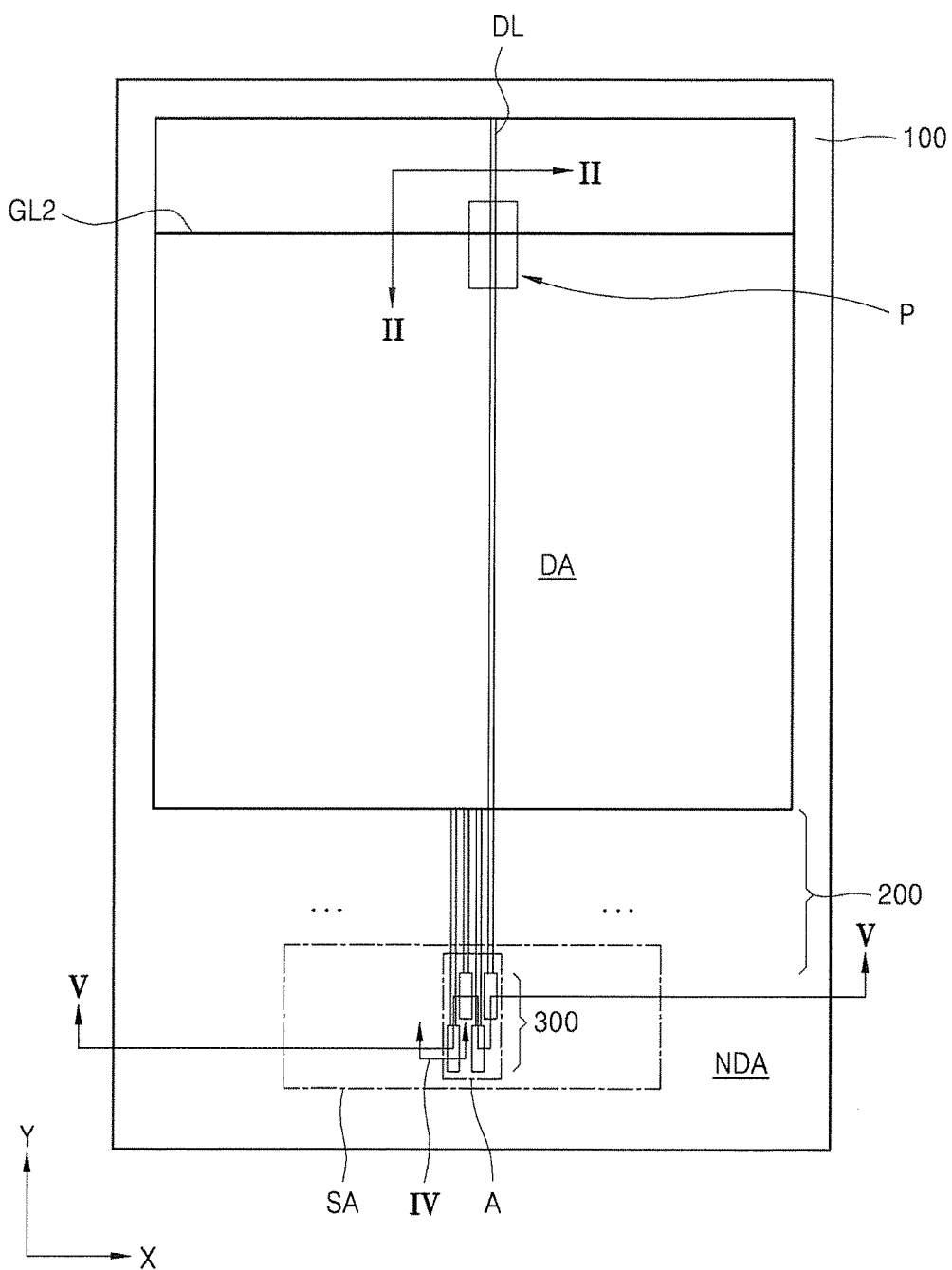
FIG. 1 is a view illustrating a substrate of a display device according to an embodiment of the present invention.
Figure 2:
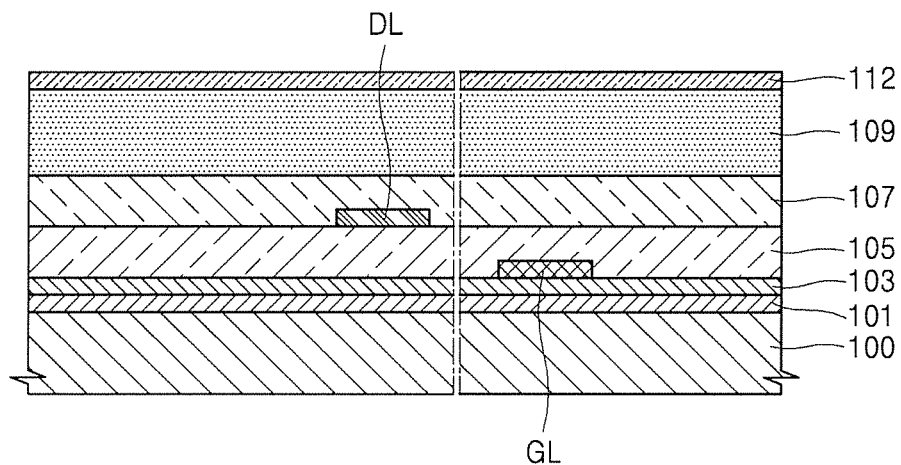
FIG. 2 is a cross-sectional view taken along line II-II of FIG. 1.
Figure 3:
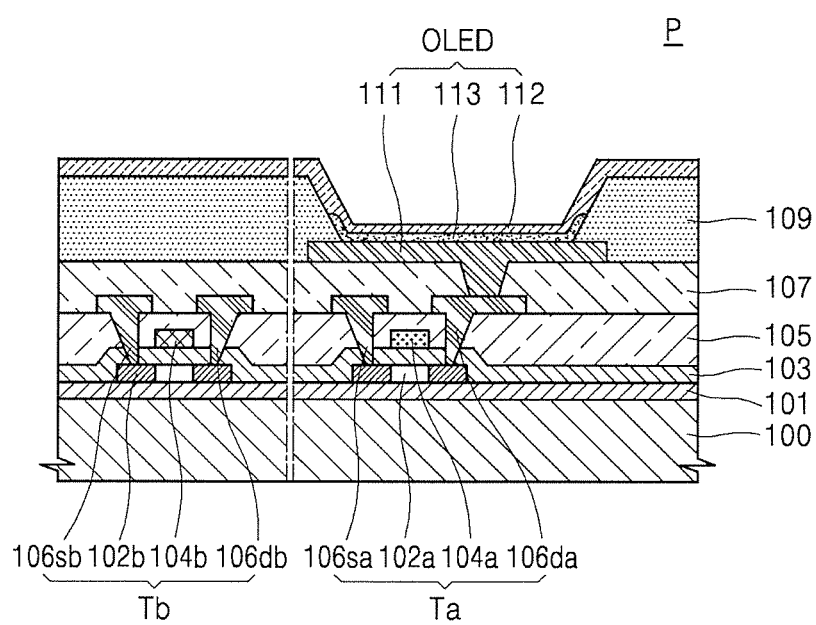
FIG. 3 is an enlarged view of a pixel portion of FIG. 1.

FIG. 1 is a view illustrating a substrate of a display device according to an embodiment of the present invention. FIG. 2 is a cross-sectional view taken along line II-II of FIG. 1. FIG. 3 is an enlarged view of a pixel portion of FIG. 1.

Referring to FIG. 1, a display device according to an embodiment includes a substrate 100 and a sealing substrate (not shown). The substrate 100 includes a display area DA where an image is displayed and a non-display area NDA around the display area DA. Additionally, a mounting area SA where a pad 300 and a driver IC described later are to be disposed may be formed in the non-display area NDA.

Moreover, although not shown, a sealing member to surround the display area DA may be disposed on the non-display area NDA in order to bond a sealing substrate that seals the display area DA from external air. However, if the sealing substrate has a shape of a thin film bag or encapsulation, the sealing member may be omitted. The sealing substrate may be disposed to face the substrate 100 with the sealing member therebetween, but the sealing substrate is not shown in FIG. 1. Hereinafter, a substrate 100 having characteristics according to embodiments of the present invention will be described in more detail.

First, referring to FIGS. 1 to 3, the display area DA of the substrate 100 will be described more specifically. Although one gate wire GL, one data wire DL, and one pixel P are shown in FIGS. 1 to 3, this is just an example and thus, a plurality of wires and pixels may be disposed in an entire display area DA.

Referring to FIGS. 1 to 3, the display area DA is an area where an image is displayed and also various signal wires and pixels P coupled (e.g., connected) to the various signal wires are disposed. Signal wires may include gate wires GL extending in a first direction and data wires DL extending in a second direction, and pixels may be disposed (or located) at the crossing areas of the gate wires GL and the data wires DL.

The gate wires GL may be disposed on a gate insulation layer 103 and may extend in a first direction X. The gate wires GL may include a previous scan line and a light emitting control line, but are not limited thereto. The gate wires GL may be coupled (e.g., connected) to a gate driving unit (not shown) or a light emitting control driving unit (not shown) to receive a scan signal or a light emitting control signal, but are not limited thereto.

The types of signal wires that the gate wires GL configure, the types of signals that the signal wires deliver, and the types, numbers, and positions of driving units coupled (e.g., connected) to signal wires are not limited to the described and shown contents and thus may be variously applied and changed according to design changes.

The data wires DL may be insulated from the gate wires GL by an interlayer insulation layer 105, and may extend in a second direction Y that crosses the first direction X. The data wires DL may be coupled (e.g., connected) to a driver IC (not shown) in a non-display area NDA through a pad and a fan-out wire. The data wire DL may receive a data signal from the driver IC through fan-out wires.

A plurality of pixels P may be disposed (or located) at the crossing areas of the gate wires GL and the data wires DL. A pixel may emit red, blue, or green light, but is not limited thereto. For example, the pixel may emit white light.

The pixel P may include an organic light emitting device (OLED) emitting light with a brightness that corresponds to a driving current corresponding to a data signal, and a pixel circuit (or, a driving circuit) controlling a driving current that flows in the OLED. In one embodiment, the pixel circuit is coupled (e.g., connected) to each of the gate wires GL and the data wires DL, and the OLED is coupled (e.g., connected) to the pixel circuit. The pixel circuit may include a plurality of thin film transistors (TFTs) Ta and Tb and at least one capacitor (not shown).

Referring to FIG. 3, a structure of a pixel P including a pixel circuit and an OLED according to an embodiment will be described in more detail.

Although two TFTs and one OLED in a pixel P are shown in FIG. 3, the pixel P may further include an additional TFT and capacitor in addition to the shown components.

The pixel P is formed on a substrate 100. The substrate 100 may be formed of a flexible material, for example, a polyimide film, in order to implement a more freely folding or bending flexible display device.

A buffer layer 101 containing an insulating material may be formed on the substrate 100 in order to provide a flat surface on the substrate and prevent the penetration of moisture and foreign materials in a direction of (or toward) the substrate 100.

A pixel circuit including TFTs Ta and Tb, a capacitor (not shown), and an OLED coupled (e.g., connected) to the pixel circuit are formed on the buffer layer 101. The TFTs Ta and Tb include (e.g., mainly include) active layers 102a and 102b, gate electrodes 104a and 104b, and source/drain electrodes 106sa, 106da, 106sb, and 106db.

For example, in the case of the first TFT Ta, the active layer 102a having a pattern (e.g., a predetermined pattern) is disposed on the buffer layer 101. The active layer 102a may include an inorganic semiconductor material such as silicon, an organic semiconductor material, or an oxide semiconductor material including an oxide such as In, Ga, Sn, Hf, and/or Zn. Additionally, a p-type or n-type dopant may be implanted. A gate insulation layer 103 may be formed on the active layer 102a. The first gate electrode 104a may be formed on the gate insulation layer 103 in correspondence to the active layer 102a. An interlayer insulation layer 105 is formed to cover the first gate electrode 104a, and the source/drain electrode 106sa and 106da are formed on the interlayer insulation layer 105 to contact an area (e.g., a predetermined area) of the active layer 102a.

In the case of the second TFT Tb, the active layer 102b having a pattern (e.g., a predetermined pattern) is disposed on the buffer layer 101. The gate insulation layer 103 is formed on the active layer 102b. The second gate electrode 104b may be formed on the gate insulation layer 103 in correspondence to the active layer 102b. An interlayer insulation layer 105 is formed to cover the second gate electrode 104b, and the source/drain electrode 106sb and 106db are formed on the interlayer insulation layer 105 to contact the active layer 102b.

Here, the gate insulation layer 103 may be a single or multi-layer formed of an inorganic material such as a silicon oxide or a silicon nitride. Additionally, here, the interlayer insulation layer 105 may be a single or multi-layer formed of an inorganic material such as a silicon oxide or a silicon nitride.

Moreover, a passivation layer 107 is formed to cover the source/drain electrodes 106sa, 106sb, 106da, and 106db of the TFTs Ta and Tb. An additional insulation layer may be further formed on the passivation layer 107 for planarization.

An OLED is formed on the passivation layer 107. The OLED may include a first electrode 111, a second electrode 112, and an interlayer 113.

The first electrode 111 is formed on the passivation layer 107. The first electrode 111 is formed to be electrically coupled (e.g., connected) to one of the source/drain electrodes 106sa, 106sb, 106da, and 106db. Also, a pixel definition layer 109 is formed to cover the first electrode 111. After an opening (e.g., a predetermined opening) is formed in the pixel definition layer 109, the interlayer 113 including an organic light emitting layer is formed in the area defined by the opening. The second electrode 112 is formed on the interlayer 113.

Moreover, when the OLED is a full-color OLED, the organic light emitting layer may be patterned into a red light emitting layer, a green light emitting layer, and a blue light emitting layer according to a red subpixel, a green subpixel, and a blue subpixel.

Additionally, the organic light emitting layer may have a multi-layer structure in which a red light emitting layer, a green light emitting layer, and a blue light emitting layer are stacked to emit white light, or may have a monolayer structure including a red light emitting material, a green light emitting material, and a blue light emitting material. The OLED including an organic light emitting layer may further include a red color filter, a green color filter, and a blue color filter in order to emit full color.

Furthermore, when a display device is a bottom emission type that emits light toward the substrate 100, the first electrode 111 may be a transparent electrode and the second electrode 112 may be a reflective electrode. Furthermore, when a display device is a top emission type that emits light toward the opposite direction of (e.g., away from) the substrate 100, the first electrode 111 may be a reflective electrode and the second electrode 112 may be a semi-transparent electrode. Furthermore, when a display device is a dual emission type, the first electrode 111 may be a transparent electrode and the second electrode 112 may be a semi-transparent electrode.

Although not shown in FIG. 3, each pixel may have a transparent window structure that allows external light to penetrate, and thus may implement a transparent display device.

Figure 4:
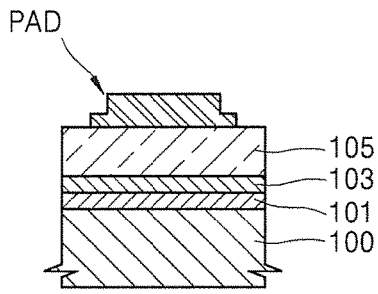
FIG. 4 is a cross-sectional view taken along line IV-IV of FIG. 1.

Referring to FIGS. 1 and 4, the non-display area NDA of the substrate 100 according to an embodiment will be described in more detail.

Figure 5:
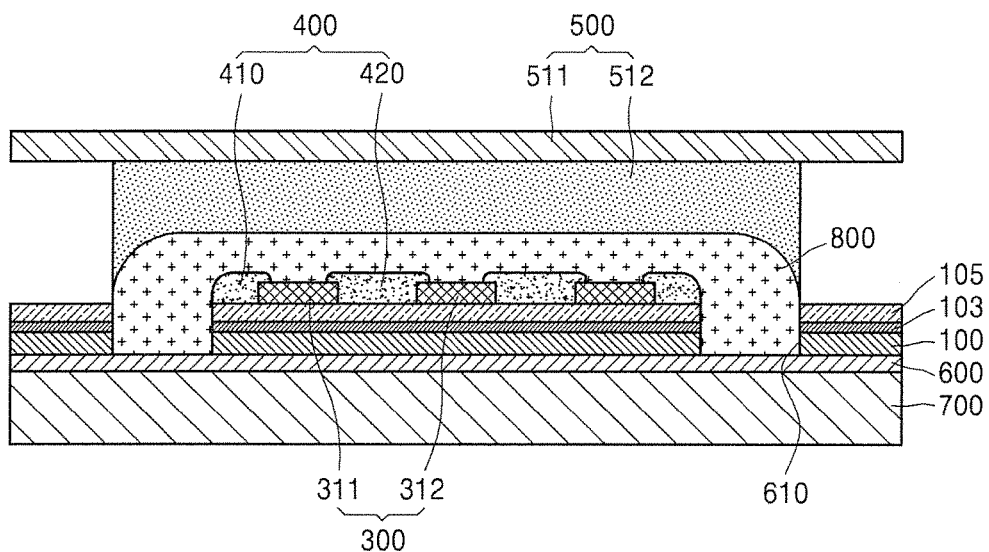
FIG. 5 is a cross-sectional view taken along line V-V of FIG. 1 and illustrates a coupling (e.g., connection) of a flexible printed circuit board according to an embodiment of the present invention.

FIG. 4 is a cross-sectional view taken along line IV-IV of FIG. 1. FIG. 5 is a cross-sectional view taken along line V-V of FIG. 1 and illustrates a coupling (e.g., connection) of a flexible printed circuit board.

Referring to FIG. 1 and FIGS. 4 and 5, the non-display area NDA is an area where no image is displayed and various members for driving a display area DA and other modules are included. In one embodiment, a driver IC (not shown), a mounting area SA including pads that couple (e.g., connect) the driver IC and the display area DA, and a fan-out part 200 are formed in the non-display area NDA.

The driver IC (not shown) may include a data driving unit for supplying a data signal, and may further include various functional units for driving the display area DA. The driver IC may be mounted on the display substrate 100 in a chip on glass (COG) type configuration. A contact terminal (not shown) electrically contacting the pads 300 on the display substrate 100 may be disposed at one side of the driver IC. A conductive layer including conductive balls may be interposed between the pads 300 and the contact terminal so that the pads 300 and the contact terminal may be bonded to each other. Examples of such a conductive layer may include an anisotropic conductive film and a self-organizing conductive film.

The pads 300 are formed on the display substrate 100, and electrically contact the contact terminal of the driver IC. The pads 300 extend from fan-out wires.

A pad area (not shown in FIG. 1) includes a pad electrode PAD. Although not shown here, the pad electrode PAD may be electrically coupled to a TFT, a capacitor Cst, or an OLED through a wire (not shown). Additionally, the pad electrode PAD may be electrically coupled (e.g., connected) to the driver IC for supplying current to drive an organic display device (not shown). Accordingly, the pad electrode PAD may receive an applied current, voltage, or signal from the driver IC and may deliver it to a TFT, a capacitor Cst, or an OLED in the display area DA of FIG. 1 through a wire.

The pad electrode PAD may be formed on the interlayer insulation layer 105. The pad electrode PAD may be formed of the same material as the source/drain electrodes 106sa, 106sb, 106da, and 106db on or at the same layer. Accordingly, in one embodiment the pad electrode PAD includes a low-resistance metallic material.

Moreover, the pad electrode PAD may include a monolayer or a multi-layer. For example, the pad electrode PAD may be formed by stacking a plurality of layers formed of the low-resistance metallic material or different materials. However, for convenience of description, a pad electrode PAD formed of a monolayer will be mainly described hereinafter.

The pads 300 include first pads 311 and second pads 312. The first pad 311 and the second pad 312 are distinguished from each other according to the coupled (e.g., connected) fan-out wires. For example, in one embodiment the first pad 311 is a pad extending from a first fan-out wire described below and the second pad 312 is a pad extending from a second fan-out wire described below. The first pads 311 and the second pads 312 may be alternately disposed.

For example, the first pad 311 may be formed at a first position of the mounting area SA. The second pad 312 may be formed at a second position of the mounting area SA. In one embodiment, the second position is not on the same line as the first position in the X direction. Accordingly, the first pad 311 and the second pad 312 are not lined up on the same line and are alternately disposed. When the first pads 311 and the second pads 312 are alternately disposed in such a way, they overlap each other in a range (e.g., a predetermined range). By doing so, many pads 300 may be disposed in a narrow space in the X direction. As a result, a dead space in the non-display area NDA may be reduced.

The fan-out wires are disposed between the pads 300 and the display area DA in order to couple (e.g., connect) the pads 300 and the display area DA. The fan-out wires include first fan-out wires and second fan-out wires. The plurality of first fan-out wires and the plurality of second fan-out wires may be alternately disposed.

According to an embodiment, the first fan-out wire is formed on the interlayer insulation layer 105. The first fan-out wire is disposed on or at the same layer as the data wire DL and is formed of the same material as the data wire DL. One end (or side) of the first fan-out wire is coupled (e.g., connected) to the first pad 311, and the other end (or side) is coupled (e.g., connected) to the display area DA, for example, coupled to the data wire DL of the display area DA. The first fan-out wire may deliver a data signal from the driver IC to the data wire DL. The second fan-out wire is formed on the interlayer insulation layer 105. The second fan-out wire is disposed on or at the same layer as the data wire DL and is formed of the same material as the data wire DL. One end (or side) of the second fan-out wire is coupled (e.g., connected) to the second pad 312, and the other end (or side) is coupled (e.g., connected) to the display area DA, for example, coupled to the data wire DL of the display area DA. The second fan-out wire may deliver a data signal from the driver IC to the data wire DL.

The first fan-out wire and the first pad 311 may be formed of the same material. For example, the first fan-out wire and the first pad 311 may include a monolayer or a multi-layer formed of a low-resistance metallic material including at least one of Mo, Al, Cu, Ag, and Ti. The second pad 312 and the second fan-out wire may be formed in the same manner as the above-mentioned first pad 311 and first fan-out wire.

Additionally, since a portion of the pad 300 exposed to the outside (or an externally exposed portion) such as the first pad 311 and the second pad 312 may be formed of a metallic material, it may be vulnerable to damage or corrosion. For example, the edges of the first pad 311 and the second pad 312 may be vulnerable to damage or corrosion according to an external environment. Accordingly, a pad protective layer 400 may be formed on each of the edges of the first pad 311 and the second pad 312.

Such a pad protective layer 400 may be formed on each of the edges of the first pad 311 and the second pad 312 after the first pad 311 and the second pad 312 are formed, and/or a flexible printed circuit board 500 may be bonded to the first pad 311 and the second pad 312. The pad protective layer 400 may include a first pad protective layer 410 and a second pad protective layer 420. Since the first pad protective layer 410 and the second pad protective layer 420 may be formed to be identical or similar to each other, for convenience of the description, only the first pad protective layer 410 will be mainly described.

In one embodiment, the first pad protective layer 410 is formed to cover the exposed first pad 311 and a portion of the interlayer insulation layer 105. The pad protective layer 410 prevents the corrosion of the border profile of the first pad 311 and the wires including Al due to exposure, so that it may serve to improve the reliability. The first pad protective layer 410 may be formed of one of an organic layer formed of acrylic, polyimide, benzocyclobutene (BCB), or silicon on glass (SOG), an inorganic layer formed of an oxide layer, $SiN_x$, $SiO_2$, $TiO_2$, atomic layer deposition (ALD), and/or $Al_2O_3$, and combinations thereof. The transparent oxide layer may include at least one selected from the group consisting of zinc oxide (ZnO), indium oxide ($In_2O_3$), indium gallium oxide (IGO), and aluminium zinc oxide (AZO).

Additionally, in a method of bonding the flexible printed circuit board 500 to the substrate 100 formed in the above manner, the substrate 100 having the display area DA and the non-display area NDA may be prepared. The substrate 100 may be prepared by coating a polyimide material on a carrier substrate (not shown).

Once the substrate 100 is prepared, a laser mark may be formed on a portion of the substrate in order to display a portion to be removed. For example, when a laser mark is projected from the bottom of the carrier substrate, the laser may be used to remove a portion of the substrate 100 where the laser is projected.

An insulation layer may be formed on a remaining portion of the substrate 100 except for a portion of the substrate 100 removed from the mounting area SA. The insulation layer may include (or may be formed of) the above-mentioned gate insulation layer 103 and interlayer insulation layer 105. For example, the gate insulation layer 103 and the interlayer insulation layer 105 may be applied during a process for forming the gate insulation layer 103 and the interlayer insulation layer 105 on the display area DA.

When the gate insulation layer 103 and the interlayer insulation layer 105 are applied, a conductive layer contact hole 610 may be formed penetrating the interlayer insulation layer 105, the gate insulation layer 103, and the first substrate 100. After the conductive layer contact hole 610 is formed, the pads 300 may be formed while the display area DA is formed. The conductive layer contact hole 610 may be formed at the border of the insulation layer having the pads 300. Once the above process is completed, after the carrier substrate is separated from the substrate 100, a portion having the pads 300 may be cleaned.

Moreover, once the above process is completed, the conductive layer 800, the flexible printed circuit board 500, and the driver IC may be disposed on the pads 300. The flexible printed circuit board 500 may include a body part 512 and a terminal part 511 on the body part 512. For example, the terminal part 511 may be electrically coupled (e.g., connected) to the body part 512, so that the terminal part 511 may be electrically coupled (e.g., connected) to the pad 300 through the conductive layer 800.

Moreover, when the flexible printed circuit board 500 is disposed as described above, the terminal part 511 may be disposed facing the pads 300. Furthermore, when the conductive layer 800 and the flexible printed circuit board 500 are disposed as described above, an adhesive layer 600 and a supporting substrate 700 may be disposed at the bottom of the substrate 100. The adhesive layer 600 may include one of a silicon inorganic layer, an oxide layer having substantially the same (or the same) insulating property as the silicon inorganic layer, or any other suitable insulating layer, and a layer including a metallic material. For example, the adhesive layer 600 may include at least one of SiNx, $SiO_2$, $Al_2O_3$, $TiO_2$, $Y_2O_3$, MgO, and ZnO. Additionally, the supporting substrate 700 may be formed of a plastic material or a SUS material.

Once the above process is completed, one side of the flexible printed circuit board 500 and one side of the supporting substrate 700 may be pressed and heated through pressure head mounting. An end part of the conductive layer 800 may enter the inside of the conductive layer contact hole 610.

For example, when pressure is applied as described above, the exposed adhesive layer 600 and the end parts of the conductive layer 800 entering the conductive layer contact hole 610 may contact each other for bonding.

When the adhesive layer 600 and the conductive layer 800 are bonded to each other as described above, the flexible printed circuit board 500, the conductive layer 800, the pad 300, the adhesive layer 600, and the supporting substrate 700 may be bonded to each other.

Moreover, in the case of a typical display device, a pad may be directly coupled (e.g., connected) to a terminal part of a flexible printed circuit board. Accordingly, in general, a tensile force applied to the flexible printed circuit board is supported only with the bonding power between a terminal part of a flexible printed circuit board and a pad.

However, in the case of a display device according to embodiments of the present invention, since a portion of the conductive layer 800 is coupled (e.g., connected) to the adhesive layer 600 through the conductive layer contact hole 610, a tensile force applied to the flexible printed circuit board 500 may be more firmly supported. For example, in the case of a display device, by increasing the bonding area of the conductive layer 800, a tensile force applied on the flexible printed circuit board 500 due to external force may be supported.

Moreover, in the case of a display device, by coupling (e.g., connecting) a portion of the conductive layer 800 and the adhesive layer 600, malfunction due to the separation of the pad 300 and the flexible printed circuit board 500 may be reduced (or prevented).

Figure 6:
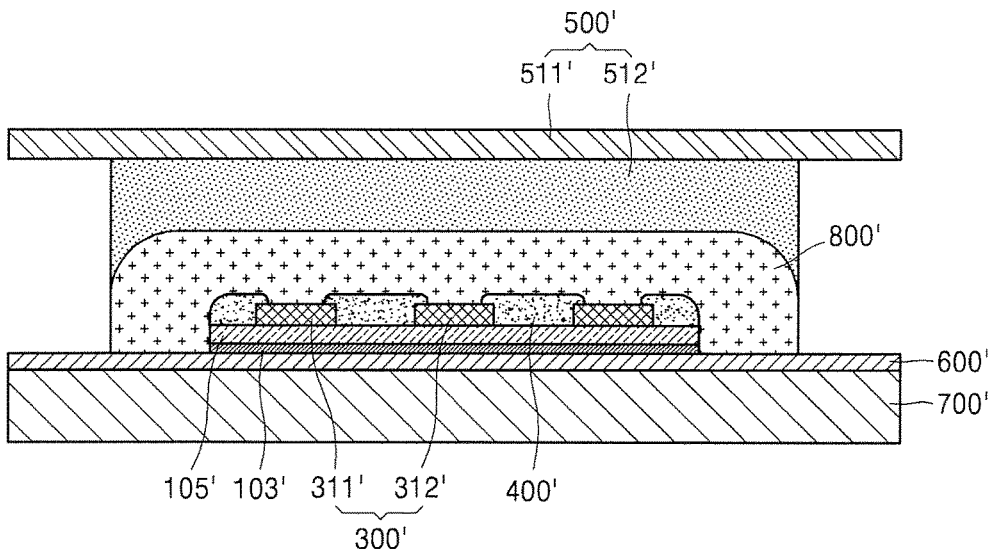
FIG. 6 is a cross-sectional view taken along line V-V of FIG. 1 and illustrates a coupling (e.g., connection) of a flexible printed circuit board according to another embodiment.

FIG. 6 is a cross-sectional view taken along line V-V of FIG. 1 and illustrates a coupling (e.g., connection) of a flexible printed circuit board according to another embodiment. Hereinafter, like reference numerals refer to like elements having substantially the same (or the same) functions and actions, and thus their overlapping descriptions may be omitted.

Referring to FIG. 1 and FIG. 6, the substrate 100 having the display area DA and the non-display area NDA may be prepared first. The substrate 100 may be prepared by coating a polyimide material on a carrier substrate (not shown).

Once the substrate 100 is prepared, a portion of the substrate 100 on a mounting area SA may be totally removed. A method of removing a portion of the substrate 100 from the mounting area SA may vary. For example, when the substrate 100 is formed on the carrier substrate through slit die coating, a polyimide material may not be applied on the carrier substrate corresponding to the mounting area SA. The above process may be performed by adjusting the shape of a slit discharging a polyimide material.

Additionally, after the substrate 100 is formed on the carrier substrate, a portion of the substrate 100 applied on the mounting area SA may be completely removed through a laser. However, for convenience of description, a method of forming the substrate 100 through a slit die coating process will be mainly described hereinafter.

Once a portion of the substrate 100 in the mounting area SA is removed, an insulation layer (not shown) may be formed on the carrier substrate 100. The insulation layer may include (or be formed of) the above-mentioned gate insulation layer 103 and interlayer insulation layer 105. For example, a gate insulation layer 103' and an interlayer insulation layer 105' may be applied during a process for forming the gate insulation layer 103' and the interlayer insulation layer 105' on the display area DA.

One the above process is completed, a pad 300' may be formed on the insulation layer on the carrier substrate. After the carrier substrate is separated from the substrate 100, a portion having the pads 300' may be cleaned.

Moreover, after a cleansing process, a conductive layer 800', a flexible printed circuit board 500', and a driver IC may be disposed on the pads 300'. The flexible printed circuit board 500' may include a body part 512' and a terminal part 511' on the body part 512'. For example, the terminal part 511' may be electrically coupled (e.g., connected) to the body part 512', so that the terminal part 511' may be electrically coupled (e.g., connected) to the pad 300' through the conductive layer 800'. A pad protective layer 400' may be formed identical or similar to the pad protective layer 400 described above.

Moreover, when the flexible printed circuit board 500' is disposed, the terminal part 511' may be disposed facing the pads 300'. Furthermore, when the conductive layer 800' and the flexible printed circuit board 500' are disposed as described above, an adhesive layer 600' and a supporting substrate 700' may be disposed at the bottom of the substrate 100. The adhesive layer 600' may include one of a silicon inorganic layer, an oxide layer having substantially the same (or the same) insulating property as the silicon inorganic layer, or any other suitable insulating layer, and a layer including a metallic material. For example, the adhesive layer 600' may include at least one of SiNx, $SiO_2$, $Al_2O_3$, $TiO_2$, $Y_2O_3$, MgO, and ZnO. Additionally, the supporting substrate 700' may be formed of a plastic material or a SUS material.

Once the above process is completed, one side of the flexible printed circuit board 500' and one side of the supporting substrate 700' may be pressed together and heated through pressure head mounting. The end part of the conductive layer 800' and a portion of the adhesive layer 600' exposed to the outside may contact each other for bonding.

When the adhesive layer 600' and the conductive layer 800' are bonded to each other as described above, the flexible printed circuit board 500', the conductive layer 800', the pad 300', the adhesive layer 600', and the supporting substrate 700' may be bonded to each other.

Accordingly, in the case of a display device, by coupling (e.g., connecting) a portion of the conductive layer 800' and the adhesive layer 600', a tensile force applied to the flexible printed circuit board 500' may be supported. For example, in the case of a display device, by increasing the bonding area of the conductive layer 800', a tensile force applied on the flexible printed circuit board 500' due to external force may be supported.

Moreover, in the case of a display device, by coupling (e.g., connecting) a portion of the conductive layer 800' and the adhesive layer 600', malfunction due to the separation of the pad 300' and the flexible printed circuit board 500' may be reduced (or prevented).

According to embodiments of the present invention, a portion of a conductive layer is coupled (e.g., connected) to an adhesive layer through a conductive layer contact hole, so that a tensile force applied on a flexible printed circuit board may be more firmly supported. For example, according to embodiments of the present invention, a tensile force applied on a flexible printed circuit board due to external force may be supported by increasing a coupling area of a conductive layer.

Moreover, according to embodiments of the present invention, by coupling (e.g., connecting) a portion of a conductive layer and an adhesive layer to each other, malfunction due to the separation of a pad and a flexible printed circuit board may be reduced (or prevented).

While the present invention has been particularly shown and described with reference to example embodiments thereof, it will be understood by those of ordinary skill in the art that various changes in form and details may be made therein without departing from the spirit and scope of the present invention as defined by the following claims and their equivalents.

What is claimed is:

1. A display device comprising:
   a substrate having a mounting area;
   a pad electrically coupled to a wire on the substrate and at the same layer as the wire;
   an adhesive layer bonded to a side of the substrate facing away from the pad;
   a supporting substrate bonded to a bottom of the adhesive layer;
   a flexible printed circuit board electrically coupled to the pad to input a power and a signal to the pad;
   a conductive layer between the flexible printed circuit board and the pad to electrically couple the flexible printed circuit board to the pad on a side of the substrate opposite the adhesive layer,
   wherein at least a portion of the adhesive layer on the mounting area is exposed to the outside to be coupled to the conductive layer; and
   an insulation layer on the substrate, wherein the adhesive layer is coupled to the conductive layer via a conductive layer contact hole in the insulation layer.

2. The display device of claim 1, wherein
   at least a portion of the insulation layer on the mounting area and at least a portion of the substrate are penetrated by the conductive layer contact hole.

3. The display device of claim 1, wherein the conductive layer contact hole is at a border of the insulation layer.

4. The display device of claim 1, wherein the conductive layer is an anisotropic conductive film or a self-organizing conductive film.

5. The display device of claim 1, further comprising a pad protective layer at ends of the pad.

6. The display device of claim 5, wherein the pad protective layer comprises at least one of an organic layer and an inorganic layer.

7. The display device of claim 1, wherein the adhesive layer comprises at least one of a silicon inorganic layer, an oxide layer having substantially the same insulating property as the silicon inorganic layer, and a metallic layer.

8. The display device of claim 1, wherein the supporting substrate is formed of a plastic or SUS material.

9. The display device of claim 1, wherein the substrate is formed of a polyimide (PI) material.

10. The display device of claim 1, wherein the flexible printed circuit board comprises:
    a body part electrically coupled to an outside; and
    a terminal part formed at one end of the body part and electrically coupled to the pad through the conductive layer.

11. A display device comprising:
    a substrate having a mounting area;
    a pad electrically coupled to a wire on the substrate and at the same layer as the wire;
    an adhesive layer bonded to a side of the substrate facing away from the pad, wherein the substrate is between the pad and the adhesive layer;
    a supporting substrate bonded to a bottom of the adhesive layer;
    a flexible printed circuit board electrically coupled to the pad to input a power and a signal to the pad; and
    a conductive layer between the flexible printed circuit board and the pad to electrically couple the flexible printed circuit board to the pad on a side of the substrate opposite the adhesive layer,
    wherein at least a portion of the adhesive layer on the mounting area is exposed to the outside to be coupled to the conductive layer.

12. A display device having a display area and a non-display area, the display device comprising:
    a substrate formed only in the display area;
    a pad electrically coupled to a wire on the substrate and at the same layer as the wire;
    an adhesive layer bonded to a side of the substrate facing away from the pad;
    a supporting substrate bonded to a bottom of the adhesive layer;
    a flexible printed circuit board electrically coupled to the pad in a mounting area of the non-display area, to input a power and a signal to the pad; and
    a conductive layer between the flexible printed circuit board and the pad to electrically couple the flexible printed circuit board to the pad on a side of the substrate opposite the adhesive layer,
    wherein at least a portion of the adhesive layer on the mounting area is exposed to the outside to be coupled to the conductive layer.

13. The display device of claim 12, further comprising an insulation layer on the substrate.

14. The display device of claim 13, wherein the insulation layer and the pad are in the mounting area where the substrate is not located, and the conductive layer surrounds a border of the insulation layer.

* * * * *